United States Patent [19]
Sano

[11] Patent Number: 6,163,187
[45] Date of Patent: Dec. 19, 2000

[54] CHARGE PUMP CIRCUIT FOR PHASE LOCKED LOOP FREE FROM SPIKE CURRENT

[75] Inventor: Masaki Sano, Tokyo, Japan

[73] Assignee: NEC Corporation, Tokyo, Japan

[21] Appl. No.: 09/356,511

[22] Filed: Jul. 19, 1999

[30] Foreign Application Priority Data

Jul. 29, 1998 [JP] Japan .................................. 10-214352

[51] Int. Cl.$^7$ ..................................................... H03L 7/06
[52] U.S. Cl. ........................... 327/157; 327/159; 327/66; 323/312; 323/315; 307/110
[58] Field of Search .................... 327/157, 159, 327/390, 536, 537, 53, 66; 363/59, 60; 323/312, 314, 315; 307/110; 330/288

[56] References Cited

U.S. PATENT DOCUMENTS

| | | | |
|---|---|---|---|
| 5,045,773 | 9/1991 | Westwick et al. | 327/542 |
| 5,512,816 | 4/1996 | Lambert | 323/315 |
| 5,627,490 | 5/1997 | Sushihara et al. | 327/510 |
| 5,656,969 | 8/1997 | Pulvirenti et al. | 327/379 |
| 5,668,501 | 9/1997 | Venes | 330/254 |
| 5,677,621 | 10/1997 | Bult et al. | 323/315 |

*Primary Examiner*—Timothy P. Callahan
*Assistant Examiner*—An T Luu
*Attorney, Agent, or Firm*—McGuireWoods LLP

[57] ABSTRACT

A phase locked loop has a charge pump circuit connected through a loop filter to a voltage controlled oscillator, and the charge pump circuit is controlled by a frequency/phase comparator, wherein the charge pump circuit includes a first current mirror circuit responsive to a first control signal for regulating a discharging current from the loop filter to a first target amount proportional to a constant current, a second current mirror circuit for regulating a reference current to a second target amount proportional to the constant current and a third current mirror circuit responsive to a second control signal for regulating a charging current to the loop filter to a third target amount proportional to the reference current, a first switching circuit for charging a first parasitic capacitor coupled to the first current mirror circuit from the constant current source and a second switching circuit for charging a second parasitic capacitor coupled to the third current mirror circuit through the second current mirror circuit, thereby setting a limit on a spike current generated at a change of the first and second control signals.

25 Claims, 3 Drawing Sheets

CHARGE PUMP CIRCUIT FOR PHASE LOCKED LOOP FREE FROM SPIKE CURRENT

FIELD OF THE INVENTION

This invention relates to a charge pump circuit used for a phase locked loop and, more particularly, to a charge pump circuit for a phase locked loop incorporated in a player for a compact disk read only memory controlled in a constant argument velocity technology.

DESCRIPTION OF THE RELATED ART

Research and development efforts are being made on a player for driving an information storage medium such as, for example, a compact disc read only memory and a digital versatile disc memory. Presently, several commercial products achieve the data read-out speed 4 times or sixteenth times larger than the data read-out speed to be required by the related standards.

The player is expected to read the data stored in the inner periphery of the disc memory as well as the data stored in the outer periphery thereof at a constant read-out speed. The controlling technology is called as "CAV" (Constant Argument Velocity). A phase locked loop is known as a controlling technology for synchronization, and the player requires both controlling technologies for generating a read-out clock signal. The phase locked loop gradually increases the frequency of the read-out clock signal for the constant argument velocity control, because the data are written into the disc memory at a constant argument velocity.

The compact disc memory is driven for rotation by a spindle motor at a constant rotating speed, and the data are read out from the rotating compact disk memory by means of a suitable pickup. However, the linear velocity on the rotating disc memory is varied from the inner peripheral area toward the outer peripheral area. This means that the length to store a data bit becomes shorter. For this reason, the phase locked loop receives the data stored in the information storage medium, and extracts the clock synchronous thereto in such a manner as to synchronize the input signal, i.e., eight-to-fourteen modulation signal.

FIG. 1 illustrates the prior art phase locked loop. The prior art phase locked loop includes a charge pump 1, a first-order or second-order loop filter 2, a voltage-controlled oscillator 3, a frequency divider 4 and a frequency/phase comparator 5. The loop filter 2 includes a capacitor C0 connected in parallel between an output node Vout1 and a ground line GND and a series combination of a resistor R1 and a capacitor C1 connected in parallel to the capacitor C0, and serves as a low-pass filter, and generates a control voltage signal CTL1 at a node N1. The voltage controlled oscillator VCO is responsive to the control voltage signal CTL1 so as to vary the frequency of an oscillation signal OSC1. The oscillation signal OSC1 is supplied to the frequency divider 4. The frequency divider 4 divides the oscillation signal OSC1, and changes the frequency from the oscillation of the voltage-controlled oscillator 3 to a frequency to be appropriate to a read-out clock signal RD1.

The read-out clock signal RD1 is supplied to the frequency/phase comparator 5, and the frequency/phase comparator 5 compares an input data signal IN1 with the read-out clock signal RD1. If the input data signal IN1 is different in frequency and phase from the read-out clock signal RD1, the frequency/phase comparator 5 supplies a control signal CTL1 indicative of increment of the frequency or a control signal CTL2 indicative of decrement of the frequency to the charge pump 1. Two direct-current power sources 6 and 7 are connected to the charge pump 1, and supply bias voltages PBIAS and NBIAS to the charge pump 1. The charge pump 1 is responsive to the control signal CTL1 so as to flow electric current to the loop filter 2. The capacitor C0 is charged with the electric current. On the other hand, when the control signal CTL2 is supplied to the charge pump 1, the charge pump 1 discharges the capacitor C0, and the electric charge flows out from the capacitor C0 to the charge pump 1. Thus, the loop filter 2 changes the control voltage signal CTL1, and, accordingly, the voltage-controlled oscillator 3 changes the frequency of the oscillation signal OSC1. The frequency/phase comparator 5, the charge pump 1, the loop filter 2, the voltage-controlled oscillator 3 and the frequency divider 4 form a control loop, and the control loop makes the frequency and the phase of the input data signal consistent with the frequency and the phase of the read-out clock signal RD1. When the frequency and the phase are consistent, the read-out clock signal RD1 and the input data signal IN1 enter synchronous state.

As described hereinbefore, the compact disc memory gradually increases the liner velocity or the read-out speed from the inner peripheral area toward the outer peripheral area. If the read-out speed is increased, the control voltage signal CTL1 rises. The charge pump 1 and the loop filter 2 vary the control voltage signal CTL1. For this reason, when the charge pump 1 raises the potential level at the output node Vout1, the control voltage signal CTL1 rises. Thus, the increase of the read-out speed results in the potential rise at the output node Vout1 of the charge pump 1. In order to raise the potential level at the output node Vout1, it is necessary to increase the current driving capability. The current driving capability is dependent on the power voltage and the power amplification capability of the output stage of the charge pump 1 or the fan-out.

FIG. 2 illustrates the charge pump 1. The prior art charge pump 1 includes a constant current source 1a connected to a power source VDD, current mirror circuits 1b/1c/1d, switching circuits 1e/1f and an inverter 1g. The current mirror circuit 1b is implemented by two series combinations of p-channel enhancement type field effect transistors P1/P2/P3/P4. Two series combinations of n-channel enhancement type field effect transistors N1/N2/N3/N4 form the current mirror circuit 1c, and one of the two series combinations N1/N2 forms the other current mirror circuit 1d together with a series combination of n-channel enhancement type field effect transistors N5/N6.

The series combination of p-channel enhancement type field effect transistors P1/P2 is connected between the power source VDD and the series combination of n-channel enhancement type field effect transistors N3/N4. The series combination of p-channel enhancement type field effect transistors P3/P4 is connected between the power source VDD and the switching circuit 1e. The switching circuit 1e is connected in series to the other switching circuit 1f. The series combination of n-channel enhancement type field effect transistors N1/N2 is connected between the constant current source 1a and a ground line GND, and the series combination of n-channel enhancement type field effect transistors N3/N4 is connected between the series combination of p-channel enhancement type field effect transistors P1/P2 and the ground line GND. The series combination of n-channel enhancement type field effect transistors N5/N6 is connected between the switching circuit 1f and the ground line GND. A p-channel enhancement type field effect transistor PUP serves as the switching circuit 1e, and the other switching circuit 1f is implemented by an n-channel enhancement type field effect transistor NDN.

Direct current I1 flows out from the constant current source 1a, and is supplied to the series combination of n-channel enhancement type field effect transistors N1/N2. The control signal CTL1 is supplied to the inverter 1g, and the inverted signal of the control signal CTL1 is supplied to the gate electrode of the p-channel enhancement type field effect transistor PUP. The other control signal CTL2 is directly supplied to the gate electrode of the n-channel enhancement type field effect transistor NDN.

The bias voltage PBIAS is supplied to the gate electrodes of the p-channel enhancement type field effect transistors P2/P4, and the other bias voltage NBIAS is supplied to the gate electrodes of the n-channel enhancement type field effect transistors N1/N3/N5. The drain node of the p-channel enhancement type field effect transistor P2 is connected to the gate electrodes of the p-channel enhancement type field effect transistors P1/P3, and the drain node of the n-channel enhancement type field effect transistor N1 is connected to the gate electrodes of the n-channel enhancement type field effect transistors N2/N4/N6. Nodes in the prior art charge pump circuit 1 are respectively labeled with Nd1, Nd2, Nd3, Nd4, Nd5, Nd6, Nd7, Nd8 and Nd9 as shown.

The current mirror circuit 1c behaves as follows. The gate width ratio between the n-channel enhancement type field effect transistor N2 and the n-channel enhancement type field effect transistor N4 is equal to the gate width ratio between the n-channel enhancement type field effect transistor N1 and the n-channel enhancement type field effect transistor N3. The bias voltage NBIAS is applied to the gate electrodes of the n-channel enhancement type field effect transistors N1/N3, which make the potential level at the node Nd1 equal to the potential level at the node Nd3. The n-channel enhancement type field effect transistor N2 has the gate electrode, the source node and the drain node equal in potential level to those of the n-channel enhancement type field effect transistor N4, respectively. As a result, the current passing through the n-channel enhancement type field effect transistor N2 and the current passing through the n-channel enhancement type field effect transistor N4 are regulated to the gate width ratio therebetween. If the gate width ratio is 1:1, the amount of current I2 is equal to the amount of current I3.

When the control signal CTL2 is changed to a high level, the n-channel enhancement type field effect transistor NDN turns on, and permits current IDOWN to flow from the loop filter 2 to the series combination of n-channel enhancement type field effect transistors N5/N6. The current mirror circuit 1d behaves as follows. The gate width ratio between the n-channel enhancement type field effect transistor N2 and the n-channel enhancement type field effect transistor N6 is equal to the gate width ratio between the n-channel enhancement type field effect transistor N1 and the n-channel enhancement type field effect transistor N5. The n-channel enhancement type field effect transistors N1/N5 are biased with the bias voltage NBIAS, and make the potential level at the node Nd1 equal to the potential level at the node Nd9. The n-channel enhancement type field effect transistor N2 has the gate electrode, the source node and the drain node equal in potential level to those of the n-channel enhancement type field effect transistor N6, respectively. As a result, the current passing through the n-channel enhancement type field effect transistor N2 and the current passing through the n-channel enhancement type field effect transistor N6 are regulated to the gate width ratio therebetween. If the gate width ratio is 1:1, the amount of current I2 is equal to the amount of current IDOWN.

When the control signal CTL1 is changed to the high level, the inverter 1g supplies the inverted signal of the low level to the gate electrode of the p-channel enhancement type field effect transistor PUP, and the current mirror circuit 1b cooperates with the current mirror circuit 1c so as to supply current IUP from the power source VDD to the loop filter 2. The current mirror circuit 1b behaves as follows. The gate width ratio between the p-channel enhancement type field effect transistor P1 and the p-channel enhancement type field effect transistor P3 is equal to the gate width ratio between the p-channel enhancement type field effect transistor P2 and the p-channel enhancement type field effect transistor P4. The bias voltage PBIAS is applied to the gate electrodes of the p-channel enhancement type field effect transistors P2/P4, which make the potential level at the node Nd4 equal to the potential level at the node Nd6. The p-channel enhancement type field effect transistor P1 has the gate electrode, the source node and the drain node equal in potential level to those of the p-channel enhancement type field effect transistor P3, respectively. As a result, the current IUP0 passing through the series combination of p-channel enhancement type field effect transistors P1/P2 and the current passing through the series combination of p-channel enhancement type field effect transistors P3/P4 are regulated to the gate width ratio therebetween. One of the currents flows into the series combination of n-channel enhancement type field effect transistors N3/N4, and becomes the current I3. The other current flows through the output node Vout1, and is labeled with "IUP". If the gate width ratio is 1:1, the amount of current passing through the series combination P1/P2 is equal to the amount of current passing through the series combination P3/P4. In the following description, the gate width ratio of the current mirror circuits 1b/1c/1d are assumed to be 1:1 for the sake of simplicity.

When the prior art charge pump 1 raises the potential level at the output node Vout1 in the constant argument velocity control, the current mirror circuit 1b keeps the relative accuracy between the current IUP and the current IUP0 in so far as the potential level at the node Nd7 is lower than the potential level at the node Nd5. The potential level V5 at the node Nd5 is given as $$V5 = VDD \cdot (I/((\tfrac{1}{2}) \times (W/L))\beta))^{1/2} \cdot |Vtp| \qquad \text{Equation 1}$$

where I is the drain current of the p-channel enhancement type field effect transistor P2, W is the gate width, L is the gate length, $\beta$ is the current amplification factor and Vtp is the threshold of the p-channel enhancement type field effect transistor P1.

If the current I, the ratio W/L and the current gain factor $\beta$ are 10 microampere, 10/0.5 and $2.5 \times 10^5$, the potential level VOUT at the output node Vout1 is given as $$VOUT = VDD - |Vth| - 0.2$$

For this reason, if the gate length L is equal, the current mirror circuit 1b keeps the relative accuracy between the current IUP and the current IUP0 equal to the gate width ratio between the p-channel enhancement type field effect transistor P1 and the p-channel enhancement type field effect transistor P3 until $VOUT = VDD - |Vth|$. As described hereinbefore, the gate width ratio is assumed to be 1:1. The current ratio between IUP and IUP0 is 1:1.

As to the current IDOWN, if the output potential VOUT becomes closer to the ground level, it is difficult to keep the relative accuracy between the currents I2 and IDOWN. Equation 1 is applicable to n-channel enhancement type field effect transistors. If the gate length is equal, the current mirror circuit 1d keeps the current ratio between I2 and IDOWN at the gate width ratio until the threshold Vtn of the n-channel enhancement type field effect transistors.

A problem inherent in the prior art charge pump circuit 1 is a spike much larger than the constant current I generated at the output node Vout1 when the frequency/phase comparator 5 changes the control signal CTL1/CTL2. In detail, parasitic capacitors PC1 and PC2 are coupled between the power source VDD and the node Nd7 and between the node Nd8 and the ground line GND. When the control signal CTL1 is changed to the high level, the charge momentarily flows, and generates the spike current. Similarly, when the control signal CTL2 is changed, the potential level is momentarily decayed toward the ground level, and large spike current flows. The spike current makes the prior art phase locked loop unstable at a high speed operation due to the charge/discharge current and the momentary impulse variation.

SUMMARY OF THE INVENTION

It is therefore an important object of the present invention to provide a charge pump, which maintains the current ratio of current mirror circuits incorporated therein until the threshold of component transistors without spike current.

In accordance with one aspect of the present invention, there is provided a charge pump circuit comprising an output node through which an output current and an input current flows, a current source connected to a first source of power voltage and flowing out a constant current, a first current mirror circuit having a first current path connected between the current source and a second source of power voltage different in potential level from the first source of power voltage, a second current path connected between the output node and the second source of power voltage and a first parasitic capacitor connected between a first control node for the second current path and the second source of power voltage, activated with a first control signal of an active level and responsive to a first potential at a first monitoring node between the current source and the first current path after the activation so as to vary a first current passing through the first current path and a second current passing through the second current path proportionally to one another, a second current mirror circuit having a third current path connected between the first source of power voltage and the output node, a fourth current path connected between the first source of power voltage and an intermediate node and a second parasitic capacitor connected between a second control node and the first source of power voltage, activated with a second control signal of an active level and responsive to a second potential at a second monitoring node between the fourth current path and the intermediate node after the activation so as to vary a third current passing through the third current path and a fourth current passing through the fourth current path proportionally to one another, a third current mirror circuit having a fifth current path connected between the constant current source and the second source of power voltage and a sixth current path connected between the intermediate node and the second source of power voltage and responsive to a third potential at a third monitoring node between the current source and the fifth current path so as to vary a fifth current passing through the fifth current path and a sixth current passing through the sixth current path proportionally to one another, a first switching circuit connected between the first control node and the second source of power voltage, and changed from an on-state to an off-state with the first control signal of the active level so as to charge the first parasitic capacitor through the first current path, and a second switching circuit connected between the second control node and the first source of power voltage, and changed from the on-state to the off-state with the second control signal of the active level so as to charge the second parasitic capacitor through the sixth current path.

BRIEF DESCRIPTION OF THE DRAWINGS

The features and advantages of the charge pump will be more clearly understood from the following description taken in conjunction with the accompanying drawings in which.

DESCRIPTION OF THE PREFERRED EMBODIMENT

Figure 1:
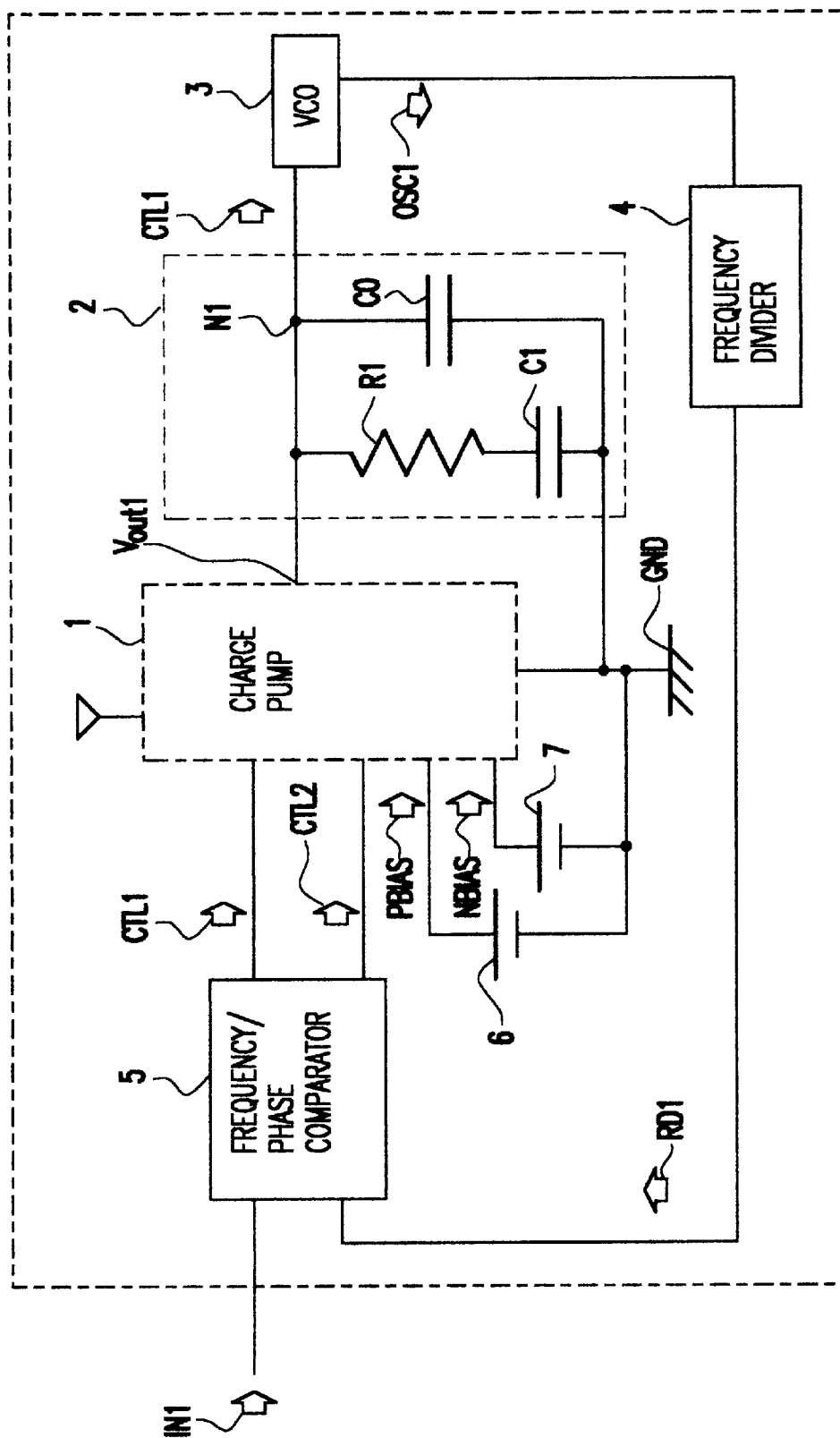
FIG. 1 is a circuit diagram showing arrangement of the prior art phase locked loop.
Figure 2:
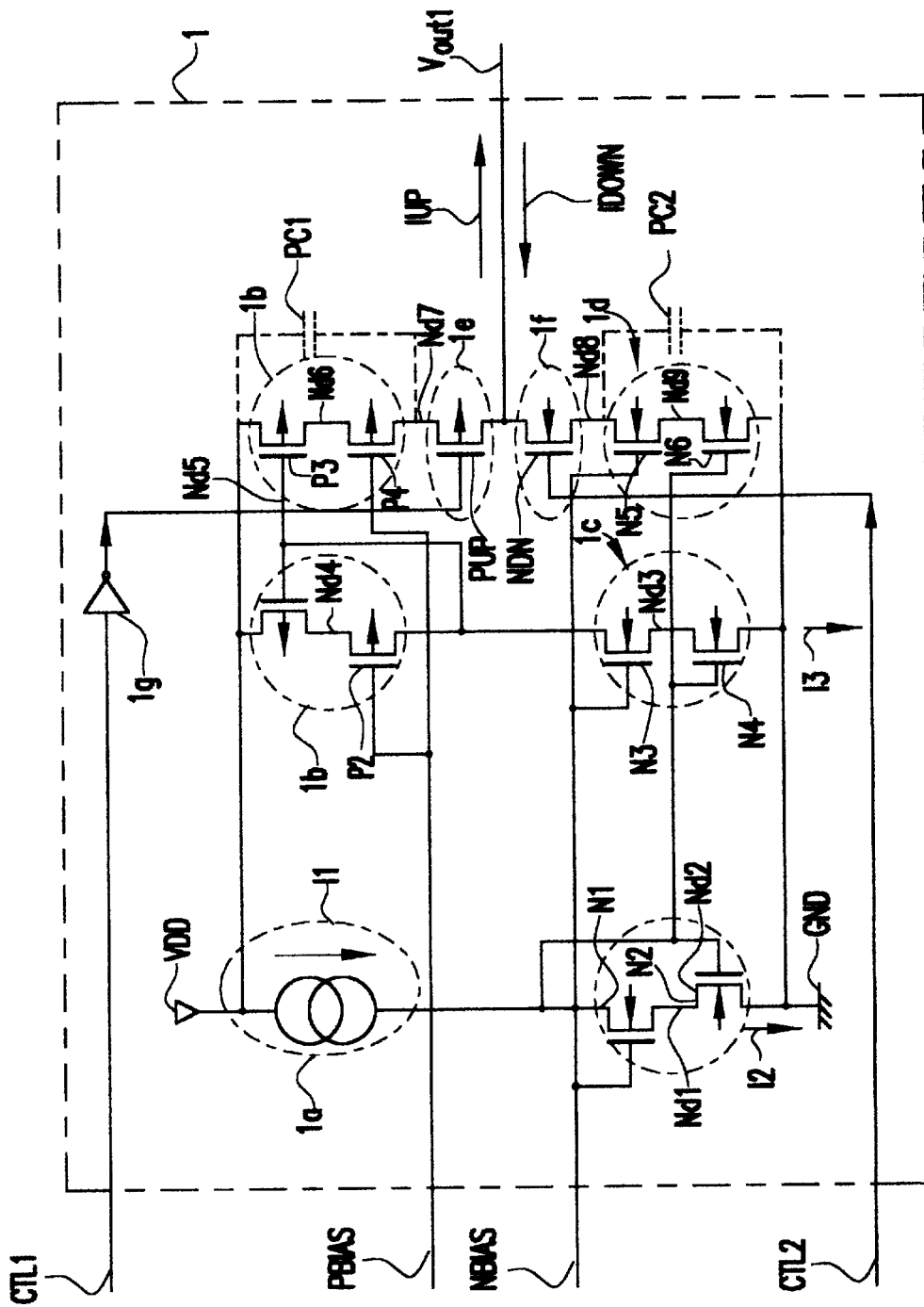
FIG. 2 is a circuit diagram showing the circuit configuration of the charge pump incorporated in the prior art phase locked loop.
Figure 3:
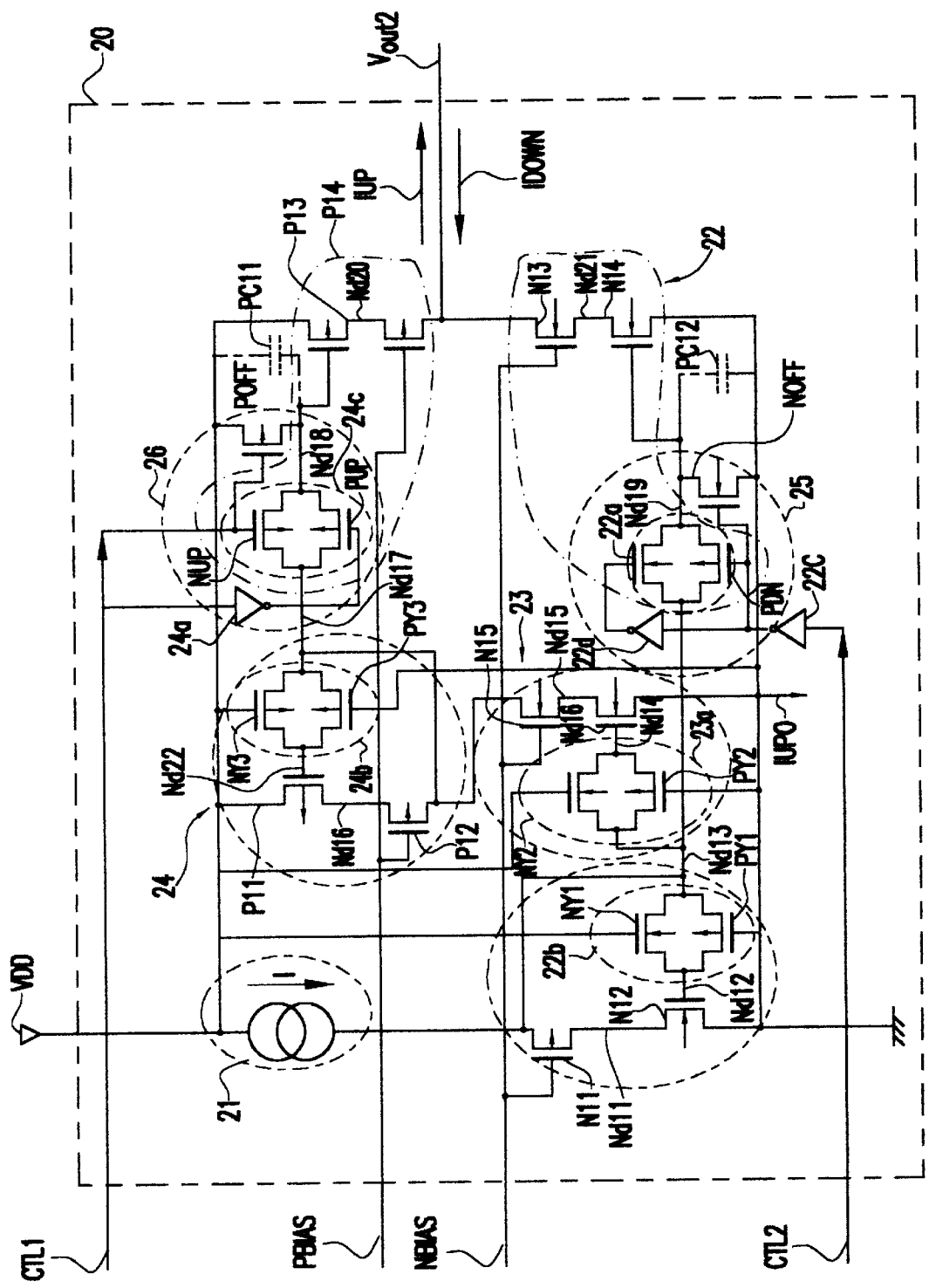
FIG. 3 is a circuit diagram showing the circuit configuration of a charge pump circuit according to the present invention.

Referring to FIG. 3 of the drawings, a charge pump 20 embodying the present invention largely comprises a constant current source 21, a first current mirror circuit 22, a second current mirror circuit 23, a third current mirror circuit 24, a first switching circuit 25 and a second switching circuit 26. The charge pump 20 forms the phase locked loop together with the loop filter 2, the voltage-controlled oscillator 3, the frequency divider 4, the frequency/phase comparator 5 and the direct current power sources 6/7.

The constant current source 21 is connected to a power source VDD, and generates direct current I. The constant current source 21 keeps the direct current I constant.

Two series combinations of n-channel enhancement type field effect transistors N11/N12 and N13/N14 form essential parts of the first current mirror 22. The first current mirror circuit 22 further includes a first analog switch 22a, a second analog switch 22b and a series of inverters 22c/22d. The series combination of n-channel enhancement type field effect transistors N11/N12 is connected between the constant current source 21 and a ground line GND, and the other series combination of n-channel enhancement type field effect transistors N13/N14 is connected between an output node Vout2 and the ground line GND. The n-channel enhancement type field effect transistors N11 and N13 are biased with the bias voltage NBIAS, and are turned on at all times. The drain node of the n-channel enhancement type field effect transistor N11 is connected through the first analog switch 22a to the gate electrode of the n-channel enhancement type field effect transistor N14 and through the second analog switch 22b to the gate electrode of the n-channel enhancement type field effect transistor N12. The gate width ratio between the n-channel enhancement type field effect transistors N12 and N14 is equal to the gate width ratio between the n-channel enhancement type field effect transistors N11 and N13.

The first analog switch 22a is implemented by a parallel combination of an n-channel enhancement type field effect transistor NDN and a p-channel enhancement type field effect transistor PDN, and another parallel combination of an n-channel enhancement type field effect transistor NY1 and a p-channel enhancement type field effect transistor PY1 serves as the second analog switch. The n-channel enhancement type field effect transistor NDN is equal in gate width/gate length ratio to the n-channel enhancement type field effect transistor NDN, and the p-channel enhancement type field effect transistor PY1 is also equal in gate width/gate length ratio to the p-channel enhancement type field effect transistor PDN. Essential nodes of the charge pump 20 are respectively labeled with Nd11, Nd12, Nd13, Nd14, Nd15, Nd16, Nd17, Nd18, Nd19, Nd20, Nd21 and Nd22 as shown.

The second analog switch 22b is turned on at all times, and the second control signal CTL2 is supplied through the inverter 22c and through the inverters 22c/22d to the first analog switch 22a. When the control signal CTL2 is changed to the high level, the inverters 22c/22d make the first analog switch 22a turn on. The first analog switch 22a is equal in on-resistance to the second analog switch 22b. For this reason, the node Nd13 is equal in potential level to the node Nd12 and the node Nd19. The node Nd13 is equal in potential level to the drain node of the n-channel enhancement type field effect transistor N11. Thus, the potential level is propagated from the drain node of the n-channel enhancement type field effect transistor N11 through the second analog switch 22b to the node Nd12 and the gate electrode of the n-channel enhancement type field effect transistor N12 and through the first analog switch 22a to the node Nd19 and the gate electrode of the n-channel enhancement type field effect transistor N14, and the gate potential of the n-channel enhancement type field effect transistor N12 is equalized to the gate potential of the n-channel enhancement type field effect transistor N14.

As to the first current mirror circuit 22, the n-channel enhancement type field effect transistor N12 has the gate electrode, the source node and the drain node equal in potential level to the gate electrode, the source node and the drain node of the n-channel enhancement type field effect transistor N14, respectively. As described hereinbefore, the constant current I is supplied from the constant current source 21 to the drain node of the n-channel enhancement type field effect transistor N11, and passes through the series combination of the n-channel enhancement type field effect transistors N11/N12. The n-channel enhancement type field effect transistors N11 and N12 are equal in gate length to the n-channel enhancement type field effect transistors N13 and N14, respectively. The drain voltage of the n-channel enhancement type field effect transistor N11 regulates discharge current IDOWN passing through the other series combination of n-channel enhancement type field effect transistors N13 and N14 in such a manner that the current ratio between the constant current I and the discharge current IDOWN is equal to the gate width ratio. If the gate width ratio is 1:1, the amount of discharge current IDOWN is equal to the amount of constant current I. Thus, the first current mirror circuit 22 takes the position corresponding to the current mirror circuit 1d of the prior art charge pump 1.

The second current mirror circuit 23 includes a series combination of n-channel enhancement type field effect transistors N15 and N16, a third analog switch 23a and the series combination of n-channel enhancement type field effect transistors N11 and N12. The third analog switch 23a is a parallel combination of an n-channel enhancement type field effect transistor NY2 and a p-channel enhancement type field effect transistor PY2, and is connected between the node Nd13 and the gate electrode of the n-channel enhancement type field effect transistor N16. The gate width ratio between the n-channel enhancement type field effect transistors N12 and N16 is equal to the gate width ratio between the n-channel enhancement type field effect transistors N11 and N15. The n-channel enhancement type field effect transistor N11 is equal in gate length to the n-channel enhancement type field effect transistor N15, and the n-channel enhancement type field effect transistor N12 is also equal in gate length to the n-channel enhancement type field effect transistor N16. The n-channel enhancement type field effect transistor NY1 is equal in gate width/gate length ratio to the n-channel enhancement type field effect transistor NY2, and the p-channel enhancement type field effect transistor PY1 is equal in gate width/gate length ratio to the p-channel enhancement type field effect transistor PY2.

The power supply line VDD is connected to the gate electrode of the n-channel enhancement type field effect transistor NY2, and the gate electrode of the p-channel enhancement type field effect transistor PY2 is connected to the source node of the n-channel enhancement type field effect transistor N12. As a result, the third analog switch 23a is turned on at all times. The third analog switch 23a has the on-resistance equal to that of the second analog switch 22b.

The n-channel enhancement type field effect transistor N15 is biased with the bias voltage NBIAS, and is turned on at all times. The node Nd11 is equal in potential level to the node Nd15. The node Nd14 is connected through the third analog switch 23a to the node Nd13, and the node Nd12 is connected through the second analog switch 22b to the node Nd13. The third analog switch 23a is equal in on-resistance to the second analog switch 22b, and the node Nd13 is equal in potential level to the drain node of the n-channel enhancement type field effect transistor N11. For this reason, the node Nd14 is equal in potential level to the node Nd12, and the nodes Nd14 and Nd12 are equalized to the potential level at the drain node of the n-channel enhancement type field effect transistor N11. Thus, the n-channel enhancement type field effect transistor N12 has the gate electrode, the source node and the drain node respectively equal to the gate electrode, the source node and the drain node of the n-channel enhancement type field effect transistor N16.

As described hereinbefore, the constant current source 21 supplies the constant current I to the drain node of the n-channel enhancement type field effect transistor N11. The above described potential relation between the nodes Nd12, Nd13 and Nd14 causes the n-channel enhancement type field effect transistor N16 to flow current IUP0, and the current ratio between the constant current I and the current IUP0 is regulated to the gate width ratio between the n-channel enhancement type field effect transistors N12 and N16. If the gate width ratio between the n-channel enhancement type field effect transistors N12 and N16 is regulated to 1:1, the amount of current IUP0 is equal to the amount of constant current I. Thus, the second current mirror circuit 23 takes the position corresponding to the current mirror circuit 1c of the prior art charge pump circuit 1.

The third current mirror circuit 24 includes a series combination of p-channel enhancement type field effect transistors P11 and P12, another series combination of p-channel enhancement type field effect transistors P13 and P14, an inverter 24a, a fourth analog switch 24b and a fifth analog switch 24c. The series combination of the p-channel enhancement type field effect transistors P11 and P12 is connected between the positive power source VDD and the n-channel enhancement type field effect transistor N15, and the other series combination of p-channel enhancement type field effect transistors P13 and P14 is connected between the positive power source VDD and the output node Vout2. The gate width ratio between the p-channel enhancement type field effect transistors P11 and P13 is equal to the gate width ratio between the p-channel enhancement type field effect transistors P12 and P14. The p-channel enhancement type field effect transistor P11 is equal in gate length to the p-channel enhancement type field effect transistor P13, and the p-channel enhancement type field effect transistor P12 is equal in gate length to the p-channel enhancement type field effect transistor P14.

The fourth analog switch 24b is implemented by a parallel combination of an n-channel enhancement type field effect transistor NY3 and a p-channel enhancement type field effect transistor PY3, and is connected between the node Nd22 and the node Nd17. The fifth analog switch 24c is implemented by a parallel combination of an n-channel enhancement type field effect transistor NUP and a p-channel enhancement type field effect transistor PUP, and is connected between the node Nd17 and the node Nd18. The n-channel enhancement type field effect transistor NY3 is equal in gate width/gate length ratio to the n-channel enhancement type field effect transistor NUP, and the p-channel enhancement type field effect transistor PY3 is equal in gate width/gate length ratio to the p-channel enhancement type field effect transistor PUP.

The positive power source VDD is connected to the gate electrode of the n-channel enhancement type field effect transistor NY3, and the gate electrode of the p-channel enhancement type field effect transistor PY3 is connected to the source node of the n-channel enhancement type field effect transistor N12. For this reason, the fourth analog switch 24b is turned on at all times, and electrically connects the node Nd22 to the node Nd17. The control signal CTL1 is directly supplied to the gate electrode of the n-channel enhancement type field effect transistor NUP, and is supplied through the inverter 24a to the gate electrode of the p-channel enhancement type field effect transistor PUP. When the control signal CTL1 is changed to the high level, the fifth analog switch 24c turns on, and electrically connects the node Nd17 to the node Nd18. Thus, the node Nd17 is electrically connectable to both of the nodes Nd22 and Nd18, and is equal in potential level to the drain node of the p-channel enhancement type field effect transistor P12. The fourth analog switch 24b is equal in on-resistance to the fifth analog switch 24c, and the fourth analog switch 24b and the fifth analog switch 24c make the nodes Nd22 and Nd18 equal in potential level to the node Nd17 and, accordingly, the potential level at the drain node of the p-channel enhancement type field effect transistor P12.

The p-channel enhancement type field effect transistors P12 and P14 are biased with the bias voltage PBIAS, and are turned on at all times. The gate width ratio of the p-channel enhancement type field effect transistors P11/P13 and P12/P14 makes the node Nd16 equal in potential level to the node Nd20. Thus, the p-channel enhancement type field effect transistor P11 has the gate electrode, the source node and the drain node respectively equal in potential level to the gate electrode, the source node and the drain node of the p-channel enhancement type field effect transistor P13. As a result, current IUP flows through the series combination of the p-channel enhancement type field effect transistors P13 and P14, and the current ratio between IUP0 and IUP is equal to the gate width ratio between the p-channel enhancement type field effect transistors P11 and P13. If the gate width ratio between the p-channel enhancement type field effect transistors P11 and P13 is 1:1, the amount of current IUP0 is equal to the amount of current IUP. Thus, the third current mirror circuit 24 takes the position corresponding to the current mirror circuit 1b of the prior art charge pump circuit 1.

The first switching circuit 25 is implemented by an n-channel enhancement type field effect transistor NOFF. The control signal CTL2 is supplied through the inverter 22c to the gate electrode of the n-channel enhancement type field effect transistor NOFF. While the control signal CTL2 is in the low level, the n-channel enhancement type field effect transistor NOFF is turned on, and the source node of the n-channel enhancement type field effect transistor N14 is electrically connected through the n-channel enhancement type field effect transistor NOFF to the gate electrode of the n-channel enhancement type field effect transistor N14. If the control signal CTL2 is changed to the high level, the inverter 22c supplies the inverted signal of the control signal CTL2 to the gate electrode of the n-channel enhancement type field effect transistor NOFF, and the n-channel enhancement type field effect transistor NOFF turns off. As a result, the gate electrode of the n-channel enhancement type field effect transistor NOFF is electrically isolated from the source node thereof, and the n-channel enhancement type field effect transistor N14 serves as the part of the current mirror circuit 22. The current IDOWN flows from the capacitor of the loop filter 2 to the ground line GND.

The second switching circuit 26 is implemented by a p-channel enhancement type field effect transistor POFF. The control signal CTL1 is directly supplied to the gate electrode of the p-channel enhancement type field effect transistor POFF. While the control signal CTL1 is in the high level, the p-channel enhancement type field effect transistor NOFF is turned off, and the source node of the p-channel enhancement type field effect transistor P13 is electrically isolated from the gate electrode thereof. This means that the p-channel enhancement type field effect transistor P13 serves as the part of the current mirror circuit 24. The current IUP flows from the positive power source VDD through the output node Vout2 to the capacitor of the loop filter 2. If the control signal CTL1 is changed to the low level, the p-channel enhancement type field effect transistor POFF turns on, and the gate electrode of the p-channel enhancement type field effect transistor POFF is electrically connected to the source node thereof.

The charge pump circuit 20 is advantageous over the prior art charge pump circuit 1. The amount of current IUP is equal to the amount of current IUP0 under the condition that the output node Vout2 is equal in potential level to or less than the node Nd17. The potential level VOUT at the output node Vout2 is given by equation 2.

$$VOUT = VDD \cdot (I/((\tfrac{1}{2}) \times (W/L) \times \beta))^{1/2} \ldots Vtp. \qquad \text{Equation 2}$$

where W is the gate width, L is the gate length, β is the current amplification factor and Vtp is the threshold voltage of the p-channel enhancement type field effect transistors. The constant current I, the gate width/gate length ratio W/L and the current amplification factor β are, by way of example, 10 microampere, 10/0.5 and $2.5 \times 10^5$, the potential level VOUT is equal to {VDD−|Vtp|−0.2}. The current mirror circuit 24 keeps the current ratio equal to the gate width ratio between the p-channel enhancement type field effect transistors P11 and P13 until the vicinity of {VDD−|Vtp|} under the condition of the same gate length. If the output voltage VOUT becomes closer to the ground level, the current ratio between IDOWN and I is liable to be fluctuate. If the component field effect transistors are the n-channel enhancement type, the above-described equation is applicable. The current mirror circuit 22 keeps the current ratio equal to the gate width ratio between the n-channel enhancement type field effect transistors N12 and N14 until vicinity of the threshold Vtn of the n-channel enhancement type field effect transistors under the condition of the same gate length. Thus, the current mirror circuits 22 and 24 keep the relative accuracy as high as those of the current mirror circuits 1d and 1b of the prior art charge pump circuit 1.

Subsequently, description is made on the transition state at the change of the control signals CTL1 and CTL2. Assuming now that the control signal CTL1 is in the low level, the p-channel enhancement type field effect transistor POFF is turned on, and the node Nd18 is equal to the positive power level Vdd of the power source VDD. When the control signal CTL1 is changed to the high level, the p-channel enhancement type field effect transistor POFF turns off, and the fifth analog switch 24c turns on. For this reason, the node Nd18 becomes equal in potential level to the node Nd17. A parasitic capacitor PC11 is coupled between the positive power source VDD and the node Nd18. The electric charge is moved toward the ground line GND with respect to the positive power source VDD for charging the parasitic capacitor PC11. The n-channel enhancement type field effect transistors N15 and N16 are connected in series to the ground line GND, and the electric charge is moved through the series combination of the n-channel enhancement type field effect transistors N15 and N16. The current mirror 23 regulates the current ratio between I and IUP0 to the gate width ratio between the n-channel enhancement type field effect transistors N12 and N16, and limits the current passing through the series combination of n-channel enhancement type field effect transistors N15/N16 or the amount of electric charge to the product between the constant current I and the reciprocate of the gate width ratio. This means that the current mirror circuit 23 does not allow a large amount of current to flow into the ground line GND. If the gate width ratio is 1:1, the amount of electric charge is equal to the constant current I at the maximum. Thus, any large spike current does not flow at the change of the control signal CTL1.

While the other control signal CTL2 is in the low level, the inverter 22c supplies the high level to the gate electrode of the n-channel enhancement type field effect transistor NOFF, and the n-channel enhancement type field effect transistor NOFF is turned on. The first analog switch 22a is turned off. For this reason, the node Nd19 and, accordingly, the gate electrode of the n-channel enhancement type field effect transistor N14 are at the ground level.

A parasitic capacitor PC12 is coupled between the node Nd19 and the ground line GND. When the control signal CTL2 is changed to the high level, the n-channel enhancement type field effect transistor NOFF turns off, and the first analog switch 22a turns on. Then, the node Nd19 is electrically connected to the node Nd13. The parasitic capacitor PC12 is charged, and the electric charge is moved from the ground line GND toward the positive power supply line VDD. The node Nd13 is connected through the drain node of the n-channel enhancement type field effect transistor N1 to the constant current source 21, and the amount of electric charge is limited by the constant current source 21. As a result, the large spike current does not flow.

As will be understood from the foregoing description, the charge pump circuit 20 according to the present invention does not flow the large spike currents. This results in enhancement of the stability of the voltage controlled oscillator 3. In other words, the voltage controlled oscillator 3 promptly changes the oscillation signal OSC1 to the target frequency.

As described hereinbefore, the charge pump circuit 20 forms the part of the phase locked loop, which is available for the constant argument velocity control over the compact disc read only memory and the digital versatile disc memory driven for rotation at the velocity four times or sixteenth times larger than the standard velocity.

As will be appreciated from the foregoing description, the analog switched 22a and 24c make the power sources VDD and GND charge the parasitic capacitors PC11 and PC12 through the current mirror circuits 22 and 23. For this reason, the current mirror circuits 22 and 23 set a limit on the amount of current used for charging the parasitic capacitors C11 and C12, and any large spike current flows through the output node Vout. The charge pump circuit 20 according to the present invention includes the analog switches 22b, 23a 24b turned on at all times, and the analog switches 22b, 23a and 24b cancel the influences of the analog switches 22a and 24c. For this reason, although the analog switches 22a and 24c are added to the charge pump circuit 20, the current mirror circuits 22, 23 and 24 are reliable as high as the current mirror circuits of the prior art charge pump circuit 1.

In the above-described embodiment, the current mirror circuits 22, 23 and 24 are corresponding to a first current mirror circuit, a second current mirror circuit and a third current mirror circuit, respectively. The gate electrode of the n-channel enhancement type field effect transistor N14 and the gate electrode of the p-channel enhancement type field effect transistor P13 serves as a first control node and a second control node, respectively. The drain node of the n-channel enhancement type field effect transistor N11 and the drain node of the p-channel enhancement type field effect transistor P12 are corresponding to the first monitoring node and a second monitoring node, respectively. The control signal CTL2 and the control signal CTL1 serve as a first control signal and a second control signal, respectively.

Although particular embodiments of the present invention have been shown and described, it will be apparent to those skilled in the art that various changes and modifications may be made without departing from the spirit and scope of the present invention.

For example, a charge pump circuit according to the present invention may be operative in a different power range. In this instance, the component field effect transistors may be changed to the opposite channel conductivity type. The component field effect transistors may be replaced with bipolar transistors.

What is claimed is:

1. A charge pump circuit comprising:

an output node through which an output current and an input current flows;

a current source connected to a first source of power voltage and flowing out a constant current;

a first current mirror circuit having a first current path connected between said current source and a second source of power voltage different in potential level from said first source of power voltage, a second current path connected between said output node and said second source of power voltage and a first parasitic capacitor connected between a first control node for said second current path and said second source of power voltage, activated with a first control signal of an active level, and responsive to a first potential at a first monitoring node between said current source and said first current path after the activation so as to vary a first current passing through said first current path and a second current passing through said second current path proportionally to one another;

a second current mirror circuit having a third current path connected between said first source of power voltage and said output node, a fourth current path connected between said first source of power voltage and an intermediate node and a second parasitic capacitor connected between a second control node and said first source of power voltage, activated with a second control signal of an active level, and responsive to a second potential at a second monitoring node between said fourth current path and said intermediate node after the activation so as to vary a third current passing through said third current path and a fourth current passing through said fourth current path proportionally to one another;

a third current mirror circuit having a fifth current path connected between said constant current source and said second source of power voltage and a sixth current path connected between said intermediate node and said second source of power voltage, and responsive to a third potential at a third monitoring node between said current source and said fifth current path so as to vary a fifth current passing through said fifth current path and a sixth current passing through said sixth current path proportionally to one another;

a first switching circuit connected between said first control node and said second source of power voltage, and changed from an on-state to an off-state with said first control signal of said active level so as to charge said first parasitic capacitor through said first current path; and a second switching circuit connected between said second control node and said first source of power voltage, and changed from the on-state to the off-state with said second control signal of said active level so as to charge said second parasitic capacitor through said sixth current path.

2. The charge pump circuit as set forth in claim 1, in which said first current path serves as said fifth current path for said third current mirror circuit, and said first monitoring node serves as said third monitoring node for said third current mirror circuit.

3. The charge pump circuit as set forth in claim 2, in which said first current mirror circuit further has a third switching circuit connected between said first monitoring node and said first control node and responsive to said first control signal of said active level so as to connect said first control node to said first monitoring node for activating said first current mirror circuit, and said second current mirror circuit further has a fourth switching circuit connected between said second monitoring node and responsive to said second control signal of said active level so as to connect said second control node to said second monitoring node for activating said second current mirror circuit.

4. The charge pump circuit as set forth in claim 3, in which said first current path, said second current path, said third current path, said fourth current path and said sixth current path have a first variable resistor with a third control node electrically connected to said first monitoring node, a second variable resistor with said first control node electrically connectable through said third switching circuit to said first monitoring node, a third variable resistor with said second control node electrically connectable through said second switching circuit to said second monitoring node, a fourth variable resistor with a fourth control node electrically connected to said second monitoring node and a fifth variable resistor with a fifth control node electrically connected to said first monitoring node, respectively.

5. The charge pump circuit as set forth in claim 4, in which said first variable resistor, said second variable resistor, said third variable resistor, said fourth variable resistor and said fifth variable resistor are implemented by a first transistor, a second transistor, a third transistor, a fourth transistor and a fifth transistor, respectively.

6. The charge pump circuit as set forth in claim 5, in which said first transistor, said second transistor, said third transistor, said fourth transistor and said fifth transistor are a kind of field effect transistor.

7. The charge pump circuit as set forth in claim 6, in which said first transistor, said second transistor and said fifth transistor are opposite in channel conductivity type to said third transistor and said fourth transistor.

8. The charge pump circuit as set forth in claim 7, in which said first current path, said second current path, said third current path, said fourth current path and said sixth current path further have a first constant load transistor connected between said first transistor and said current source, a second constant load transistor connected between said output node and said second transistor, a third constant load transistor connected between said third transistor and said output node, a fourth constant load transistor connected between said fourth transistor and said intermediate node and a fifth constant load transistor connected between said fifth transistor and said intermediate node, respectively, and said first constant load transistor, said second constant load transistor and said fifth constant load transistor are identical in channel conductivity type with said first transistor, said second transistor and said fifth transistor and opposite in channel conductivity type to said third constant load transistor and said fourth constant load transistor.

9. The charge pump circuit as set forth in claim 8, in which said first constant load transistor, said second constant load transistor and said fifth constant load transistor are biased with a first constant bias voltage so as to be in the on-state at all times, and said third constant load transistor and said fourth constant load transistor are biased with a second constant bias voltage so as to be in the on-state at all times.

10. The charge pump circuit as set forth in claim 3, in which said first current mirror circuit, said second current mirror circuit and said third current mirror circuit further have a first constant resistive element connected between said third control node and said first monitoring node, a second constant resistive element connected between said fourth control node and said second monitoring node and a third constant resistive element connected between said fifth control node and said first monitoring node, respectively.

11. The charge pump circuit as set forth in claim 10, in which said first constant resistive element, said second constant resistive element and said third constant resistive element are approximately equal in resistance to said third switching circuit, said fourth switching circuit and said first constant resistive element, respectively.

12. The charge pump circuit as set forth in claim 11, in which said first variable resistor, said second variable resistor, said third variable resistor, said fourth variable resistor and said fifth variable resistor are implemented by a first transistor, a second transistor, a third transistor, a fourth transistor and a fifth transistor, respectively.

13. The charge pump circuit as set forth in claim 12, in which said first transistor, said second transistor, said third transistor, said fourth transistor and said fifth transistor are a kind of field effect transistor.

14. The charge pump circuit as set forth in claim 13, in which said first transistor, said second transistor and said fifth transistor are opposite in channel conductivity type to said third transistor and said fourth transistor.

15. The charge pump circuit as set forth in claim 14, in which said first current path, said second current path, said third current path, said fourth current path and said sixth current path further have a first constant load transistor connected between said first transistor and said current source, a second constant load transistor connected between said output node and said second transistor, a third constant load transistor connected between said third transistor and said output node, a fourth constant load transistor connected between said fourth transistor and said intermediate node and a fifth constant load transistor connected between said fifth transistor and said intermediate node, respectively, and said first constant load transistor, said second constant load transistor and said fifth constant load transistor are identical in channel conductivity type with said first transistor, said second transistor and said fifth transistor and opposite in channel conductivity type to said third constant load transistor and said fourth constant load transistor.

16. The charge pump circuit as set forth in claim 15, in which said first constant load transistor, said second constant load transistor and said fifth constant load transistor are biased with a first constant bias voltage so as to be in the on-state at all times, and said third constant load transistor and said fourth constant load transistor are biased with a second constant bias voltage so as to be in the on-state at all times.

17. The charge pump circuit as set forth in claim 3, in which said first current path includes a first constant load transistor connected to said first monitoring node, a first variable load transistor connected between said first constant load transistor and said second source of power voltage and a first constant resistive element connected between a third control node of said first variable load transistor and said first monitoring node and equal in resistance to said third switching circuit; said second current path includes a second constant load transistor connected to said output node, a second variable load transistor connected between said second constant load transistor and said second source of power voltage and having said first control node electrically connectable through said third switching circuit to said first monitoring node; said third current path includes a third variable load transistor connected to said first source of power voltage and a third constant load transistor connected between said third variable load transistor and said output node and having said second control node electrically connectable through said fourth switching circuit to said second monitoring node; said fourth current path includes a fourth variable load transistor connected to said first source of power voltage, a fourth constant load transistor connected between said fourth variable load transistor and said intermediate node and a second constant resistive element connected between a fourth control node of said fourth variable load transistor and said second monitoring node and equal in resistance to said fourth switching circuit; and said sixth current path includes a fifth constant load transistor connected to said intermediate node, a fifth variable load transistor connected between said fifth constant load transistor and said second source of power voltage and a third constant resistive element connected between a fifth control node of said fifth variable load transistor and said first monitoring node and equal in resistance to said first constant resistive element.

18. The charge pump circuit as set forth in claim 17, in which said first constant load transistor, said second constant load transistor, said third constant load transistor, said fourth constant load transistor, said fifth constant load transistor, said first variable load transistor, said second variable load transistor, said third variable load transistor, said fourth variable load transistor, said fifth variable load transistor, said first switching circuit and said second switching circuit are a first field effect transistor of one channel conductivity type, a second field effect transistor of said one channel conductivity type, a third field effect transistor of the other channel conductivity type opposite to said one channel conductivity type, a fourth field effect transistor of said other channel conductivity type, a fifth field effect transistor of said one channel conductivity type, a sixth field effect transistor of said one channel conductivity type, a seventh field effect transistor of said one channel conductivity type, an eighth field effect transistor of said other channel conductivity type, a ninth field effect transistor of said other channel conductivity type, a tenth field effect transistor of said one channel conductivity type, an eleventh field effect transistor of said one channel conductivity type connected in parallel to said first parasitic capacitor and a twelfth field effect transistor of said other channel conductivity type connected in parallel to said second parasitic capacitor, respectively.

19. The charge pump circuit as set forth in claim 18, said first field effect transistor, said second field effect transistor and said fifth field effect transistor are biased with a first bias voltage so as to remain in on-state at all times, and said third field effect transistor and said fourth field effect transistor are biased with a second bias voltage so as to remain in the onstate at all times.

20. The charge pump circuit as set forth in claim 19, in which said first field effect transistor, said second field effect transistor and said fifth field effect transistor are equal in gate length; said third field effect transistor and said fourth field effect transistor are equal in gate length; said sixth field effect transistor, said seventh field effect transistor and said tenth field effect transistor are equal in gate length; and said eighth field effect transistor and said ninth field effect transistor are equal in gate length.

21. The charge pump circuit as set forth in claim 20, in which the ratio between the gate width of said first field effect transistor and the gate width of said second field effect transistor is equal to the ratio between the gate width of said sixth field effect transistor and the gate width of said seventh field effect transistor; the ratio between the gate width of said third field effect transistor and the gate width of said fourth field effect transistor is equal to the ratio between the gate width of said eighth field effect transistor and the gate width of said ninth field effect transistor; and the ratio between the gate width of said first field effect transistor and the gate width of said fifth field effect transistor is equal to the ratio between the gate width of said sixth field effect transistor and the gate width of said tenth field effect transistor.

22. The charge pump circuit as set forth in claim 17, in which said first constant resistive element, said second constant resistive element, said third constant resistive element, said third switching circuit and said fourth switching circuit are a first parallel combination of a first field effect transistor of one channel conductivity type and a second field effect transistor of the other channel conductivity type opposite to said one channel conductivity type, a second parallel combination of a third field effect transistor of said one channel conductivity type and a fourth field effect transistor of said other channel conductivity type, a third parallel combination of a fifth field effect transistor of said one channel conductivity type and a sixth field effect transistor of said other channel conductivity type, a fourth parallel combination of a seventh field effect transistor of said one channel conductivity type and an eighth field effect transistor of said other channel conductivity type and a fifth parallel combination of a ninth field effect transistor of said one channel conductivity type and a tenth field effect transistor of said other channel conductivity type, respectively.

23. The charge pump circuit as set forth in claim 22, in which the ratio between a gate width and a gate length is equal between said first field effect transistor, said fifth field effect transistor and said ninth field effect transistor; the ratio between a gate width and a gate length is equal between said second field effect transistor, said fourth field effect transistor and said tenth field effect transistor; the ratio between a gate electrode and a gate length is equal between said fifth field effect transistor and said seventh field effect transistor; and the ratio between a gate width and a gate length is equal between said sixth field effect transistor and said eighth field effect transistor.

24. The charge pump circuit as set forth in claim 10, said charge pump circuit forms a phase locked loop together with a voltage controlled oscillator having a control node and an output node, a loop filter connected between said output node of said charge pump circuit and said control node of said voltage controlled oscillator, a frequency divider connected to said output node of said voltage controlled oscillator for producing a read-out clock signal and a frequency and phase comparator having two input nodes supplied with said read-out clock signal and an input data signal and comparing said read-out clock signal with said input data signal for selectively producing said first control signal and said second control signal.

25. The charge pump circuit as set forth in claim 24, in which said phase locked loop is used for a constant argument velocity control over a disc memory.

* * * * *